United States Patent
Tanaka et al.

(10) Patent No.: US 9,613,730 B2
(45) Date of Patent: Apr. 4, 2017

(54) CABLE BRANCH STRUCTURE

(71) Applicant: YAZAKI CORPORATION, Minato-ku, Tokyo (JP)

(72) Inventors: Masahiro Tanaka, Kakegawa (JP); Hajime Kato, Kakegawa (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 14/368,912

(22) PCT Filed: Dec. 21, 2012

(86) PCT No.: PCT/JP2012/008194
§ 371 (c)(1),
(2) Date: Jun. 26, 2014

(87) PCT Pub. No.: WO2013/099185
PCT Pub. Date: Jul. 4, 2013

(65) Prior Publication Data
US 2014/0338970 A1    Nov. 20, 2014

(30) Foreign Application Priority Data

Dec. 28, 2011 (JP) .................................. 2011-287946

(51) Int. Cl.
*H02G 3/04* (2006.01)
*H02G 3/06* (2006.01)
(Continued)

(52) U.S. Cl.
CPC ........... *H01B 7/0045* (2013.01); *H01R 9/032* (2013.01); *H01R 13/6593* (2013.01);
(Continued)

(58) Field of Classification Search
CPC .............. H01B 7/0045; H01R 13/6593; H01R 2105/00; H01R 9/032; H05K 9/0098
(Continued)

(56) References Cited

U.S. PATENT DOCUMENTS 4,640,980 A * 2/1987 Batt ......................... H05K 9/00
174/36
4,678,865 A * 7/1987 Sherwin ............... A61B 5/0478
174/103

(Continued)

FOREIGN PATENT DOCUMENTS

CN         86102854 A     11/1986
CN         100570962 C    12/2009
(Continued)

OTHER PUBLICATIONS

Japanese office action letter issued on Sep. 1, 2015 in the counterpart Japanese patent application.
(Continued)

*Primary Examiner* — Timothy Thompson
*Assistant Examiner* — Rhadames J Alonzo Miller
(74) *Attorney, Agent, or Firm* — Mots Law, PLLC

(57) ABSTRACT

A cable branch structure (1) branches, from a main line (30A) to branch lines (30B, 30C), a shielded cable (30) with electric wires (10) covered with a braided wire (20). The braided wire (20) includes: a main line side braided wire (20A) constituting a part corresponding to the main line (30A); and branch line side braided wires (20B, 20C), respectively, constituting parts corresponding to the respective branch lines (30B, 30C). The braided wire (20) includes at least one of a first mounting portion (100; 110) provided at an end portion of the main line side braided wire (20A) for mounting end portions of the branch line side braided wires (20B, 20C) and second mounting portions (100; 120, 130)
(Continued)

provided at each of the end portions of the branch line side braided wires (20B, 20C) for mounting the end portion of the main line side braided wire (20A).

20 Claims, 8 Drawing Sheets

(51) Int. Cl.
*H01B 7/00* (2006.01)
*H01R 9/03* (2006.01)
*H01R 13/6593* (2011.01)
*H05K 9/00* (2006.01)
*H02G 15/188* (2006.01)
*H01R 105/00* (2006.01)

(52) U.S. Cl.
CPC ......... *H02G 15/188* (2013.01); *H05K 9/0098* (2013.01); *H01R 2105/00* (2013.01); *H02G 3/0487* (2013.01)

(58) Field of Classification Search
USPC ....................................................... 174/72 A
See application file for complete search history.

(56) References Cited

U.S. PATENT DOCUMENTS

| | | | | |
|---|---|---|---|---|
| 5,232,380 A | * | 8/1993 | Inoue | H01R 13/6593 439/585 |
| 6,160,216 A | * | 12/2000 | McMahon | H01B 7/0045 174/102 R |
| 6,246,001 B1 | * | 6/2001 | Fukui | H01R 9/034 174/78 |
| 7,550,666 B2 | | 6/2009 | Burland et al. | |
| 2002/0163415 A1 | * | 11/2002 | Ide | H01R 43/0228 336/206 |
| 2004/0057187 A1 | * | 3/2004 | Kuboshima | H01R 9/032 361/118 |
| 2007/0095552 A1 | * | 5/2007 | Thierolf | H01B 7/0861 174/36 |
| 2009/0130903 A1 | * | 5/2009 | Tsukashima | H01R 9/032 439/607.23 |
| 2010/0261365 A1 | * | 10/2010 | Sakakura | H01R 9/032 439/271 |
| 2013/0056256 A1 | * | 3/2013 | Guillanton | H01R 9/0503 174/359 |
| 2016/0064118 A1 | * | 3/2016 | Wakabayashi | H01B 7/0018 174/72 A |

FOREIGN PATENT DOCUMENTS

| | | |
|---|---|---|
| EP | 0165861 A1 | 12/1985 |
| EP | 0199216 A2 | 10/1986 |
| GB | 1021369 A | 3/1966 |
| JP | 2010250995 A | 11/2010 |
| WO | 2006132391 A1 | 12/2006 |

OTHER PUBLICATIONS

Chinese office action letter issued on Sep. 21, 2015 in the counterpart Chinese patent application.
Official Action issued on Oct. 4, 2016 in the counterpart European patent application.

* cited by examiner (a)

(b)

(a)

(b)

CABLE BRANCH STRUCTURE

TECHNICAL FIELD

The present invention relates to a cable branch structure used for a connection between devices (for example, a motor or an inverter) accommodated in a metal case.

BACKGROUND ART

To date, in an electric vehicle (EV), a hybrid electric vehicle (HEV), and the like, various proposals have been given about a shield structure used for a connection between devices (for example, a motor and an inverter) accommodated in a metal case (refer to PTL 1).

In PTL 1, a shield structure includes a shielded cable including a plurality of collected electric wires covered with a braided wire, terminals respectively connected to both ends of the shielded cable, and connectors provided with both ends of the shielded cable and connected respective terminals.

Each of the connectors includes a conductive metal shell which is mounted to a case accommodating therein a device and which covers inner conductors (such as terminals). Each of end portions of the braided wire is connected to each of the metal shells. Accordingly, the braided wire is electrically connected to the cases, thus enabling to prevent radiation of electromagnetic waves.

CITATION LIST

Patent Literature

[PTL 1]
US 2010/0261365 A1

SUMMARY OF INVENTION

However, according to the above conventional shield structure, a plurality of shielded cables are necessary for connecting a plurality (for example, two) of devices from one device. That is, the conventional shield structure has such a problem as to require preparing a plurality of first connectors each provided at a first end of each of the shielded cables and a plurality of second connectors each provided at a second end of each of the shielded cables, thus enlarging a space for disposing the first and second connectors.

Then, for reducing the space for disposing at least the first connector, it is conceivable to branch a shielded cable from a main line into a plurality of branch lines from one first connector toward the plurality of second connectors. However, the branching of the shielded cable necessarily accompanies branching of the braided wire. Therefore, various kinds of braided wires have to be produced in accordance with the configurations, directions or the like of branches of the shielded cable, resulting in increase of production cost of the braided wire.

It is, therefore, an object of the present invention to provide a cable branch structure capable of reducing a space for disposing a connector mounted to one end of a shielded cable while reducing production cost of a braided wire.

For solving the above problem, according to a first aspect of the present invention, there is provided a cable branch structure for branching, from a main line into a plurality of branch lines, a shielded cable with a plurality of electric wires covered with a braided wire. The braided wire includes: a main line side braided wire constituting a part corresponding to the main line; a plurality of branch line side braided wires, respectively, constituting parts corresponding to the respective branch lines; and at least one of a first mounting portion provided at an end portion of the main line side braided wire for mounting end portions of the branch line side braided wires and second mounting portions provided at each of the end portions of the branch line side braided wires for mounting the end portion of the main line side braided wire.

By the above structure, at least one of the first and second mounting portions branches the electric wires from the main line so as to correspond to each of the branch lines. Therefore, a space for disposing the connector mounted to the end portion of the main line can be reduced.

In addition, the branch line side braided wires can cover the electric wires corresponding to the respective branch lines, thus eliminating the need of branching the braided wire itself. Therefore, the existing braided wire can be used without producing various kinds of braided wires in accordance with the configurations, directions or the like of branches of the shielded cable. Thus, the production cost of the braided wire can be reduced, while increasing the application and versatility of the braided wire 20.

The first mounting portion may include a main line mounting portion configured to be mounted to the end portion of the main line side braided wire, and then the main line mounting portion is formed with a plurality of branch line mounting openings to which the end portions of the respective branch line side braided wires are mounted, and the electric wires corresponding to each of the branch lines are inserted into one of the branch line mounting openings.

By the above structure, the branch line mounting openings facilitate branching of the electric wires from the main line so as to correspond to the respective branch lines, and, in addition, the main line mounting portion reinforces the end portion of the main line side braided wire. The above performances enable to easily mount the branch line side braided wires to the main line side braided wire and also to reduce the production cost of the cable branch structure.

Each of the second mounting portions may include a branch line mounting portion provided at each of the end portions of the respective branch line side braided wires, and then the branch line mounting portion is formed with a main line mounting opening to which the end portion of the main line side braided wire is mounted, and the electric wires corresponding to each of the branch line are inserted into the main line mounting opening.

By the above structure, the main line mounting openings facilitate branching of the electric wires from the main line so as to correspond to each of the branch lines and the branch line mounting portions reinforce the end portions of the respective branch line side braided wires. The above performances can facilitate mounting of the end portions of the branch line side braided wires to the end portions of the main line side braided wire and also reduce the production cost of the cable branch structure.

The first mounting portion may include a metal ring around which the end portion of the main line side braided wire wound, and then the metal ring is formed with inserting holes each into which, among the plurality of the electric wires, the electric wires corresponding to one of the branch lines which are branched from the electric wires corresponding to another of the branch lines are inserted.

By the above structure, without complicating the structure of the first mounting portion, the first mounting portion can be simplified and formed at low cost, thus enabling to further reduce the production cost of the cable branch structure.

In accordance with the first aspect of the present invention, the production cost of the braided wire can be reduced while enabling to reduce the space for disposing the connector mounted to the one end of the shielded cable.

DESCRIPTION OF EMBODIMENTS

Figure 1:
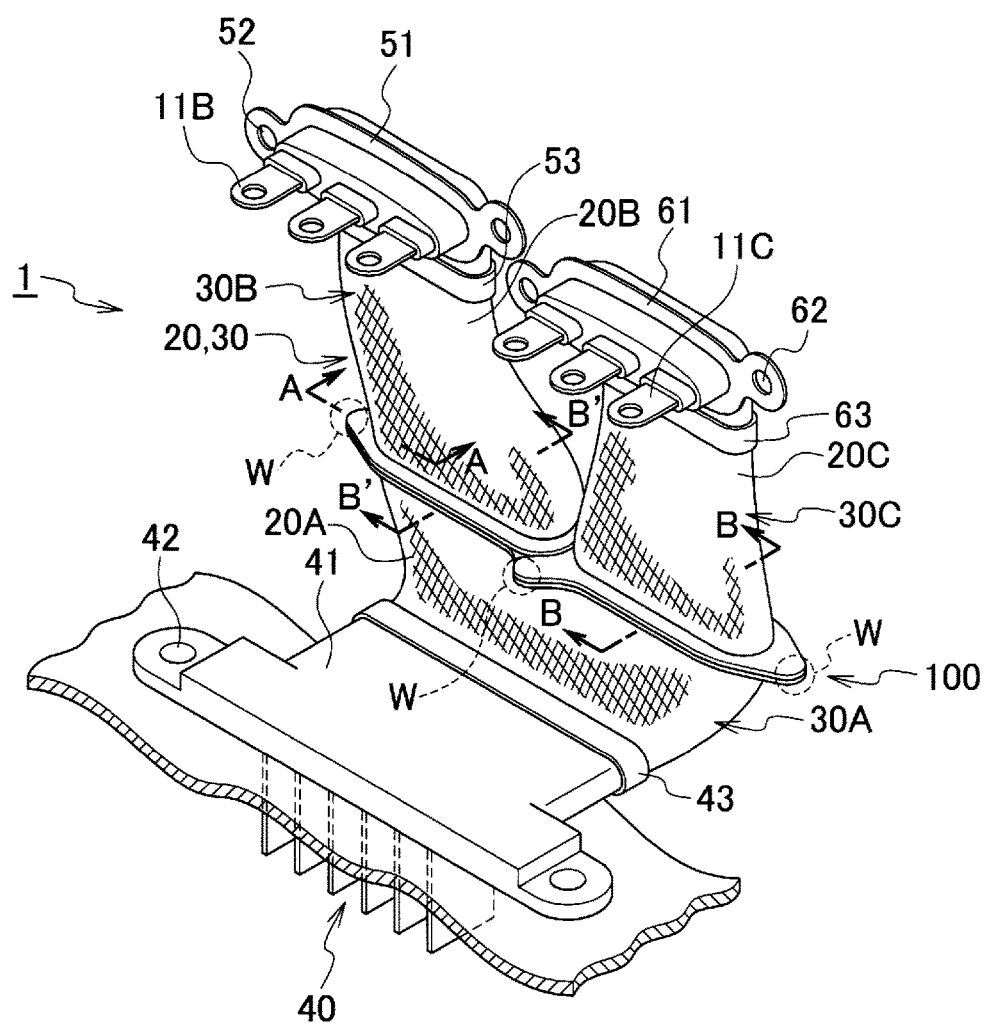
FIG. 1 is a perspective view illustrating a cable branch structure according to a first embodiment.

A cable branch structure according to embodiments of the present invention will be explained with reference to drawings.

In the following description of the drawings, the same or similar reference numerals or signs will be affixed to the same or similar portions. However, it should be noted that the drawings are schematic and, therefore, ratios or the like of each dimension are different from those of the actual ones.

Thus, specific dimensions or the like should be determined by referring to the following explanation. Further, among the drawings, portions having mutually different dimensional relations or mutually different dimensional ratios may be included.

(1) First Embodiment (1.1) Formation of Cable Branch Structure

A formation of a cable branch structure 1 according to a first embodiment will be explained with reference to FIGS. 1 and 2.

Figure 2:
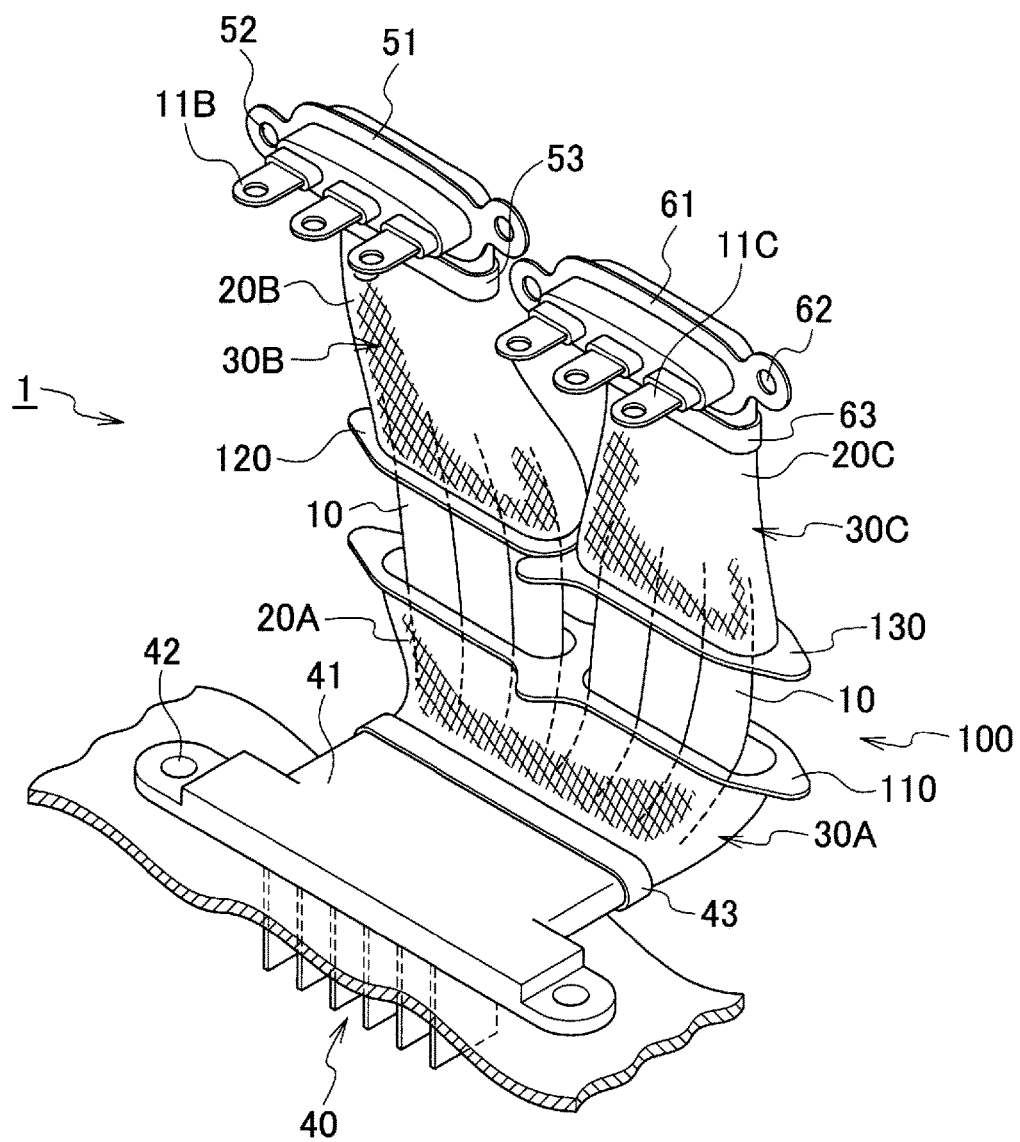
FIG. 2 is a partially exploded perspective view illustrating the cable branch structure according to the first embodiment.

As illustrated in FIGS. 1 and 2, the cable branch structure 1 is used for a connection between devices (for example, a motor or an inverter) accommodated in a conductive metal case. The cable branch structure 1 has such a structure as that a shielded cable 30 including a plurality of electric wires 10 and covered with a braided wire 20 is branched from a main line 30A into a plurality (two in the first embodiment) of branch lines 30B, 30C.

A distal end of each of the electric wires 10 corresponding to the main line 30A is provided with a terminal (not illustrated) which is mounted to the connector 40. The connector 40 is mated with a mating connector (not illustrated) connected to the device in the metal case and is electromagnetically shielded by a conductive metal shell 41 for covering inner conductors (terminals or the like). The metal shell 41 is formed with a plurality of inserting holes 42 for inserting therein fixing members such as bolts for fixing the metal shell 41 to the metal case.

Terminals 11B, 11C are provided at distal ends of the electric wires 10 corresponding to the respective branch lines 30B, 30C, and the terminals 11B, 11C are mounted to connectors (not illustrated), respectively. The connector is mated with the mating connector (not illustrated) connected to the device in the metal case and is electromagnetically shielded by conductive metal shells 51, 61 for covering inner conductors (such as terminals). Each of the metal shells 51, 61 is provided with a plurality of inserting holes 52, 62, respectively, each for inserting therein a fixing member such as a bolt for fixing the metal shells 51, 61 to the metal case.

The braided wire 20 is electrically connected to the metal case for preventing the radiation of electromagnetic waves. The braided wire 20 includes a main line side braided wire 20A constituting a part corresponding to the main line 30A, a branch line side braided wire 20B constituting a part corresponding to the branch line 30B and a branch line side braided wire 20C constituting a part corresponding to the branch line 30C.

A first end portion of the main line side braided wire 20A is fixed to the metal shell 41 by being crimped with a crimp member 43 in such a state as to cover a part of the metal shell 41.

Each of the branch line side braided wires 20B, 20C is formed as a separate body from the main line side braided wire 20A. A first end portion of the branch line side braided wire 20B is fixed to the metal shell 51 by being crimped with a crimp member 53 in such a state as to cover a part of a metal shell 51. A first end portion of the branch line side braided wire 20C is fixed to the metal shell 61 by being crimped with a crimp member 63 in such a state as to cover a part of a metal shell 61.

Each of a second end portion of the main line side braided wire 20A and second end portions of the respective branch line side braided wires 20B, 20C is provided with a mounting portion 100 capable of mounting the second end portion of the main line side braided wire 20A and the second end portions of the branch line side braided wires 20B, 20C.

(1.2) Formation of Mounting Portion

A formation of the mounting portion 100 will be explained with reference to FIGS. 1 to 4.

Figure 3:
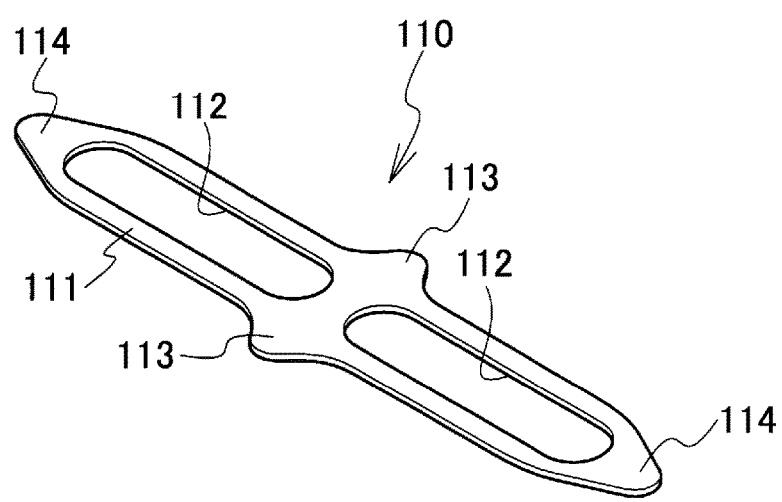
FIG. 3(a) is a perspective view illustrating a main line mounting portion according to the first embodiment.
FIG. 3(b) is a perspective view illustrating branch line mounting portions according to the first embodiment.
Figure 3:
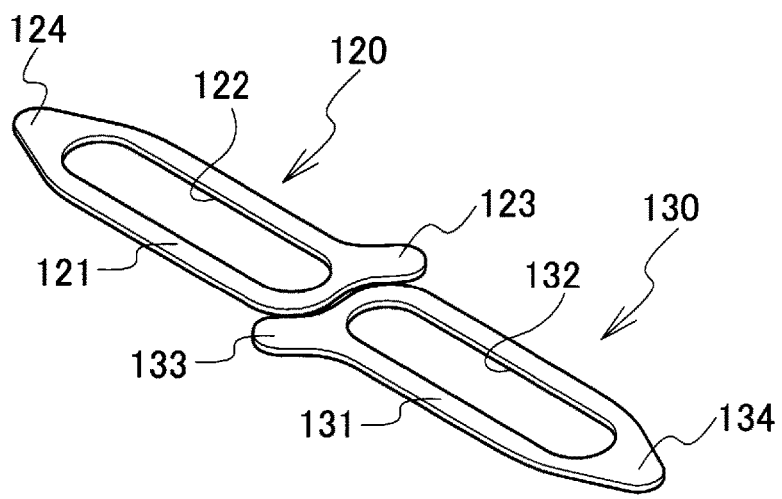
Figure 4:
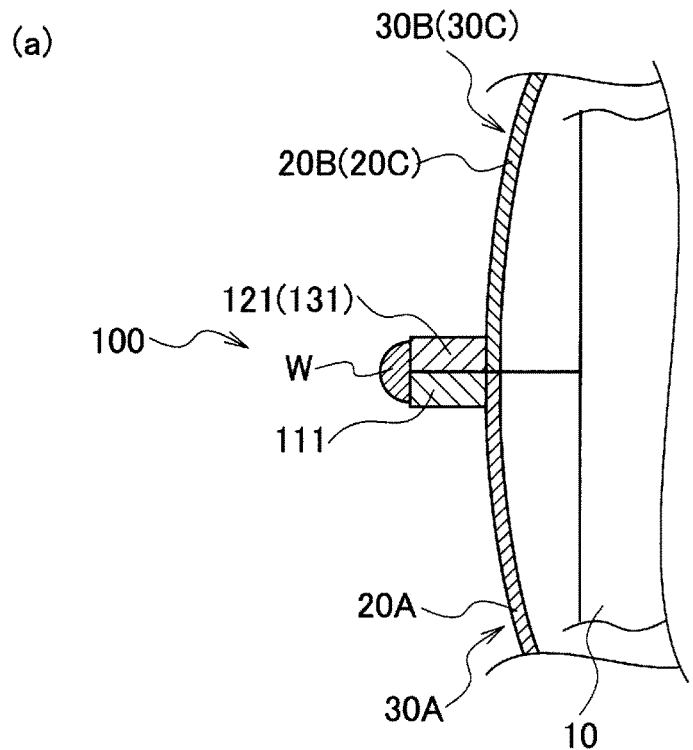
FIG. 4(a) is a cross sectional view (cross section along the line A-A in FIG. 1) illustrating a mounting portion of the cable branch structure according to the first embodiment.
FIG. 4(b) is a cross sectional view (cross section along the line B-B or B'-B' in FIG. 1) illustrating the mounting portion of the cable branch structure according to the first embodiment.
Figure 4:
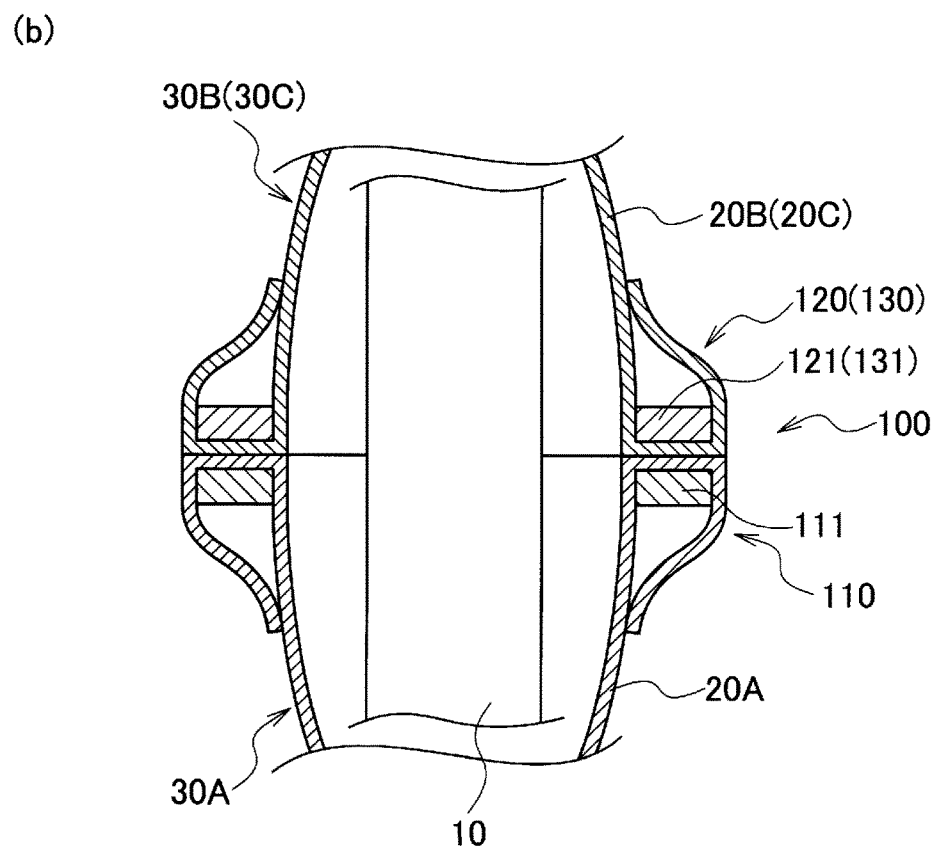

As illustrated in FIGS. 2 to 4, the mounting portion 100 includes a main line mounting portion 110 provided at the end portion of the main line side braided wire 20A, a branch line mounting portion 120 provided at the end portion of the branch line side braided wire 20B, and a branch line mounting portion 130 provided at the end portion of the branch line side braided wire 20C.

The main line mounting portion 110 is capable of individually mounting the end portion of each of the branch line side braided wires 20B, 20C to the end portion of the main line side braided wire 20A. The main line mounting portion 110 includes the end portion of the main line side braided wire 20A, and an ellipsoidal plate-like metal ring 111 around which the end portion of the main line side braided wire 20A is wound.

As illustrated in FIG. 3(a), the metal ring 111 is formed with a plurality (two in the first embodiment) of inserting holes 112 into which the electric wires 10 corresponding to the branch line 30B are inserted in a manner to be branched from the electric wires 10 corresponding to the other branch line 30C. Although not illustrated in FIGS. 1 and 2, but as illustrated in FIG. 4(b), the end portion of the main line side braided wire 20A is folded back from inside to outside in such a manner as to be wound into the inserting hole 112 of the metal ring 111, and thus the main line mounting portion 110 is disposed at the end portion of the main line side braided wire 20A.

Further, the metal ring 111 is formed with a central side bulging portions 113 formed between the first inserting hole 112 and the second inserting hole 112, and end portion side bulging portions 114 formed at one side end portion of each of the inserting holes 112.

Accordingly, a plurality of branch line mounting openings to which the branch line side braided wires 20B, 20C are, respectively, mounted are formed by the inserting holes 112 at the main line mounting portion 110, and the electric wires 10 corresponding to the respective branch lines 30B, 30C are inserted into the inserting holes 112, 112 (refer to FIG. 4). Further, the central side bulging portion 113 and the end portion side bulging portion 114 bulge outwardly from the main line side braided wire 20A.

The branch line mounting portions 120, 130 are capable of individually mounting the respective branch line side braided wires 20B, 20C to the main line side braided wire 20A. The branch line mounting portion 120 includes the end portion of the branch line side braided wire 20B, and an ellipsoidal plate-like metal ring 121 around which the end portion of the branch line side braided wire 20B is wound. The branch line mounting portion 130 includes the end portion of the branch line side braided wire 20C, and an ellipsoidal plate-like metal ring 131 around which the end portion of the branch line side braided wire 20C is wound.

As illustrated in FIG. 3(b), the metal ring 121 is formed with an inserting hole 122 into which the electric wires 10 corresponding to the branch line 30B are inserted in a branched state, while the metal ring 131 is formed with an inserting hole 132 into which the electric wires 10 corresponding to the branch line 30C are inserted in a branched state. Although not illustrated in FIGS. 1 and 2, but as illustrated in FIG. 4(b), the end portion of the branch line side braided wire 20B is folded back from inside to outside in such a manner as to be wound into the inserting hole 122 of the metal ring 121; thus, the branch line mounting portion 120 is disposed at the end portion of the branch line side braided wire 20B, while the end portion of the branch line side braided wire 20C is folded back from inside to outside in such a manner as to be wound into the inserting hole 132 of the metal ring 131; thus, the branch line mounting portion 130 is disposed at the end portion of the branch line side braided wire 20C.

The metal ring 121 is formed with a central side bulging portion 123 so formed on the other metal ring 131 side as to correspond to the central side bulging portion 113, and an end portion side bulging portion 124 so formed at one side end side of the inserting hole 122 as to correspond to the end portion side bulging portion 114. The metal ring 131 is formed with a central side bulging portion 133 so formed on the other metal ring 121 side as to correspond to the central side bulging portion 113, and an end portion side bulging portion 134 so formed at one side end side of the inserting hole 132 as to correspond to the end portion side bulging portion 114.

In the branch line mounting portion 120, a main line mounting opening to which the main line side braided wire 20A is mounted is formed by the inserting hole 122, and the electric wires 10 corresponding to the branch line 30B is inserted into the main line mounting opening 122. In the branch line mounting portion 130, a main line mounting opening to which the main line side braided wire 20A is mounted is formed by the inserting hole 132, and the electric wires 10 corresponding to the branch line 30C is inserted into the main line mounting opening 132. The central side bulging portion 123 and the end portion side bulging portion 124 bulge outwardly from the branch line side braided wire 20B (refer to FIG. 4(a)). The central side bulging portion 133 and the end portion side bulging portion 134 bulge outwardly from the branch line side braided wire 20C (refer to FIG. 4(a)).

As set forth above, in the cable branch structure 1, the branch line mounting portions 120, 130 are mounted to the main line mounting portion 110 such that the central side bulging portions 113, 113 correspond to the central side bulging portions 123, 133 and the end portion side bulging portions 114, 114 correspond to the end portion side bulging portions 124, 134. Further, the metal ring 111 is fixed to each of the metal rings 121, 131 by a welding W (such as seam welding, spot welding, and soldering) (refer to FIGS. 1 and 4(a)), to thereby fix the main line mounting portion 110 to each of the branch line mounting portions 120, 130.

(1.3) Operations and Effects

As explained above, with respect to the cable branch structure 1 according to the first embodiment, the main line side braided wire 20A and the branch line side braided wires 20B, 20C are provided with the mounting portion 100 capable of mounting the other. Accordingly, the mounting portion 100 branches the electric wires 10 from the main line 30A such that the electric wires 10 corresponds to each of the branch lines 30B, 30C. Therefore, a space for disposing the connector 40 mounted to the end portion of the main line 30A can be reduced.

In addition, the branch line side braided wire 20B can cover the electric wires 10 corresponding to the branch line 30B and the branch line side braided wire 20C can cover the electric wires 10 corresponding to the branch line 30C, thus eliminating the need of branching the braided wire 20 itself. Therefore, the existing braided wire 20 can be used without producing various kinds of braided wires 20 in accordance with the configurations, directions or the like of branches of the shielded cable 30. Thus, the production cost of the braided wire 20 can be reduced, while increasing the application and versatility of the braided wire 20.

In the first embodiment, the mounting portion 100 includes the main line mounting portion 110, and the electric wires 10 corresponding to the respective branch lines 30B, 30C are inserted into the branch line mounting openings 112 formed at the main line mounting portion 110. Accordingly, the branch line mounting openings 112 facilitate to so branch the electric wires 10 from the main line 30A as to correspond to the respective branch lines 30B, 30C, and the main line mounting portion 110 reinforces the end portion of the main line side braided wire 20A. Therefore, it is possible to easily mount the branch line side braided wires 20B, 20C to the main line side braided wire 20A and also to reduce the production cost of the cable branch structure 1.

In the first embodiment, the mounting portion 100 includes the branch line mounting portions 120, 130, the electric wires 10 corresponding to the branch line 30B are inserted into the main line mounting opening 122 formed at the branch line mounting portion 120, and the electric wires 10 corresponding to the branch line 30C are inserted into the main line mounting opening 132 formed at the branch line mounting portion 130. The above structure facilitates branching of the electric wires 10 from the main line 30A by the main line mounting openings 122, 132 so as to correspond to each of the branch lines 30B, 30C, and, in addition, the branch line mounting portions 120, 130 reinforce the end portions of the respective branch line side braided wires 20B, 20C. The above structure facilitates mounting of the end portions of the branch line side braided wires 20B, 20C to the end portions of the main line side braided wire 20A and also reduces the production cost of the cable branch structure 1.

In the first embodiment, the mounting portion 100 includes the metal rings 111, 121, 131 around each of which the end portion of the braided wire 20 is wound. Accordingly, without complicating the structure of the mounting portion 100, the mounting portion 100 can be simplified and formed at low cost, thus enabling to further reduce the production cost of the cable branch structure 1.

For preventing a shear surface from contacting the braided wire 20, a flange or the like may be provided at the metal rings 111, 121, 131 (inserting holes 112, 122, 132). In this case, the braided wire 20 can be prevented from causing a friction with the shear surface of each of the metal rings 111, 121, 131. Therefore, breakage of the braided wire 20 can be suppressed, thus enabling to allow the braided wire 20 to improve the performance of preventing the radiation of the electromagnetic waves (so-called a shield reliability).

(2) Second Embodiment

With respect to a cable branch structure 2 according to a second embodiment, an explanation will be made with reference to FIGS. 5 to 7. Further, the same reference numerals or signs are affixed to the same portions as those of the cable branch structure 1 according to the first embodiment stated above, and different portions will be mainly explained.

In the first embodiment, the metal ring 111 is fixed to each of the metal rings 121, 131 by the welding W (such as seam welding, spot welding, and soldering).

On the other hand, in the second embodiment, the metal ring 111 is fixed to each of the metal rings 121, 131 with bolts B and nuts N.

Figure 5:
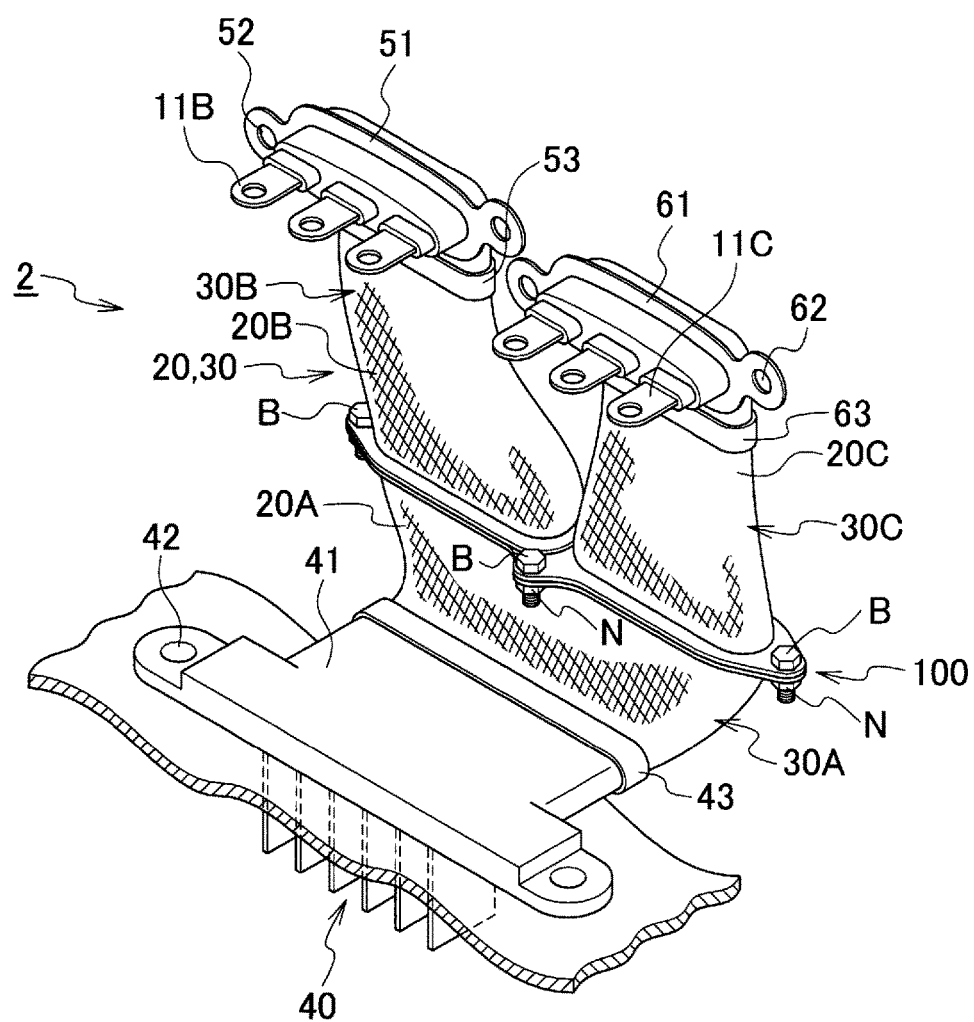
FIG. 5 is a perspective view illustrating a cable branch structure according to a second embodiment.
Figure 6:
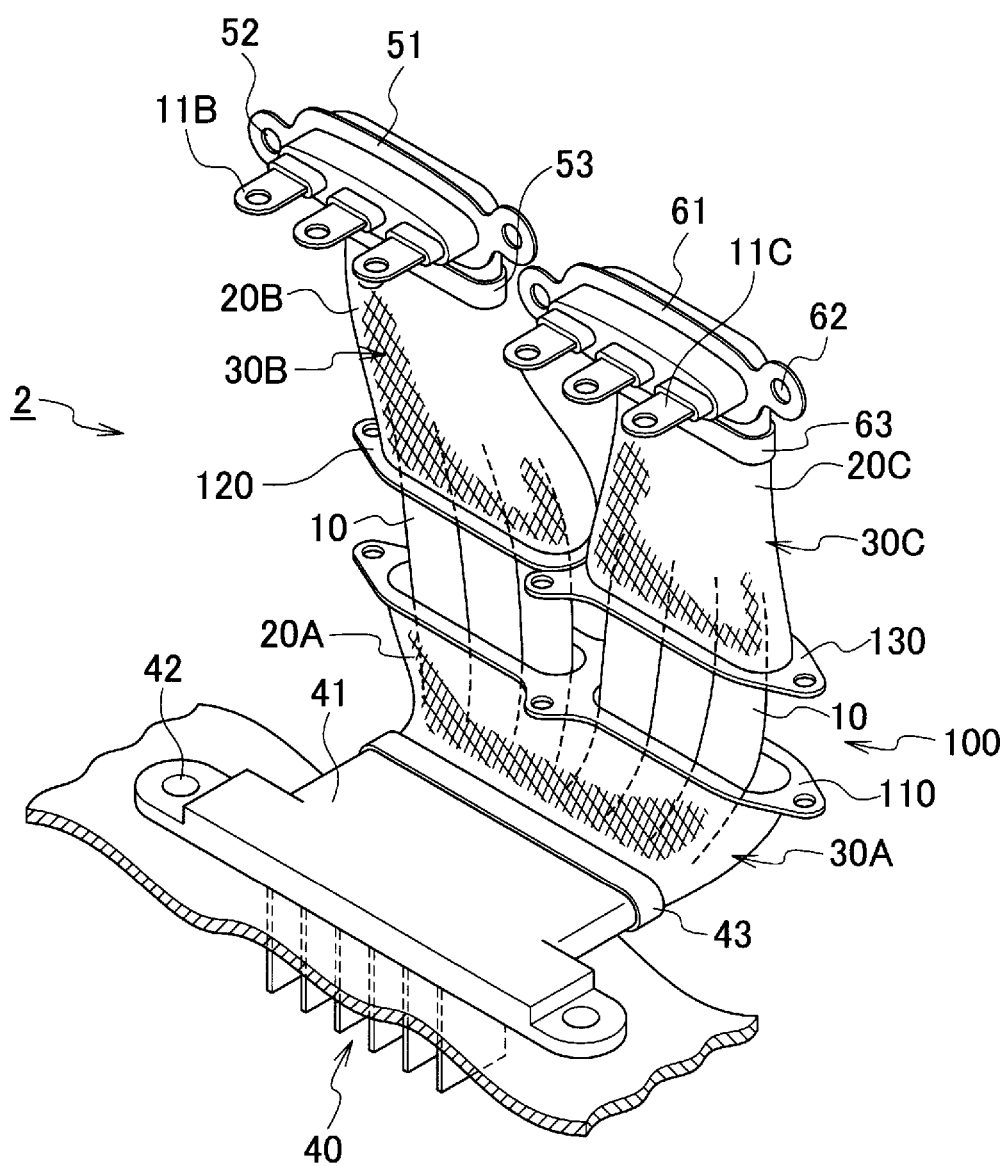
FIG. 6 is a partially exploded perspective view illustrating the cable branch structure according to the second embodiment.
Figure 7:
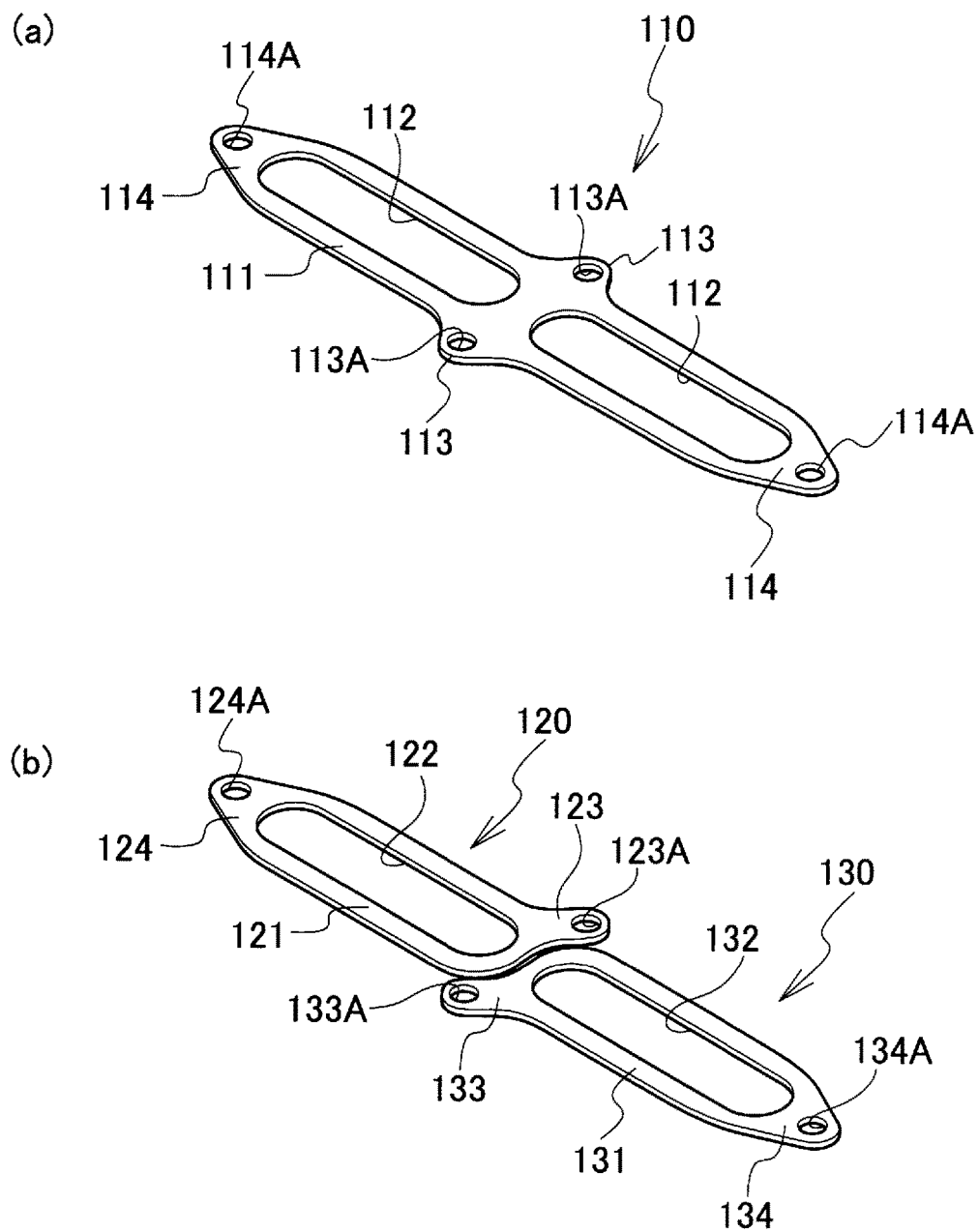
FIG. 7(a) is a perspective view illustrating a main line mounting portion according to the second embodiment.
FIG. 7(b) is a perspective view illustrating branch line mounting portions according to the second embodiment.

Specifically, as illustrated in FIGS. 5 to 7, the central side bulging portions 113 and the end portion side bulging portions 114 at the metal ring 111 are formed, respectively, with bolt inserting holes 113A, 114A into each of which the bolt B is inserted.

The central side bulging portion 123 and the end portion side bulging portion 124 at the metal ring 121 are formed, respectively, with bolt inserting holes 123A, 124A into each of which the bolt B is inserted. The central side bulging portion 133 and the end portion side bulging portion 134 at the metal ring 131 are formed, respectively, with bolt inserting holes 133A, 134A into each of which the bolt B is inserted.

Tightening the nut N with the bolt B inserted into each of the bolt inserting holes fixes the metal ring 111 to each of the metal rings 121, 131.

As explained above, in the second embodiment, similarly to the operations and effects of the first embodiment, the production cost of the braided wire 20 can be reduced without branching the braided wire 20 itself, while enabling to reduce the space for disposing the connector 40 mounted to the one end of the shielded cable 30.

Further, in the second embodiment, the metal ring 111 is fixed to each of the metal rings 121, 131 with the bolts B and nuts N. Therefore, the fixing strength between the metal ring 111 and each of the metal rings 121, 131 is increased, thus enabling to improve the reliability of the cable branch structure 2.

(3) Third Embodiment

Figure 8:
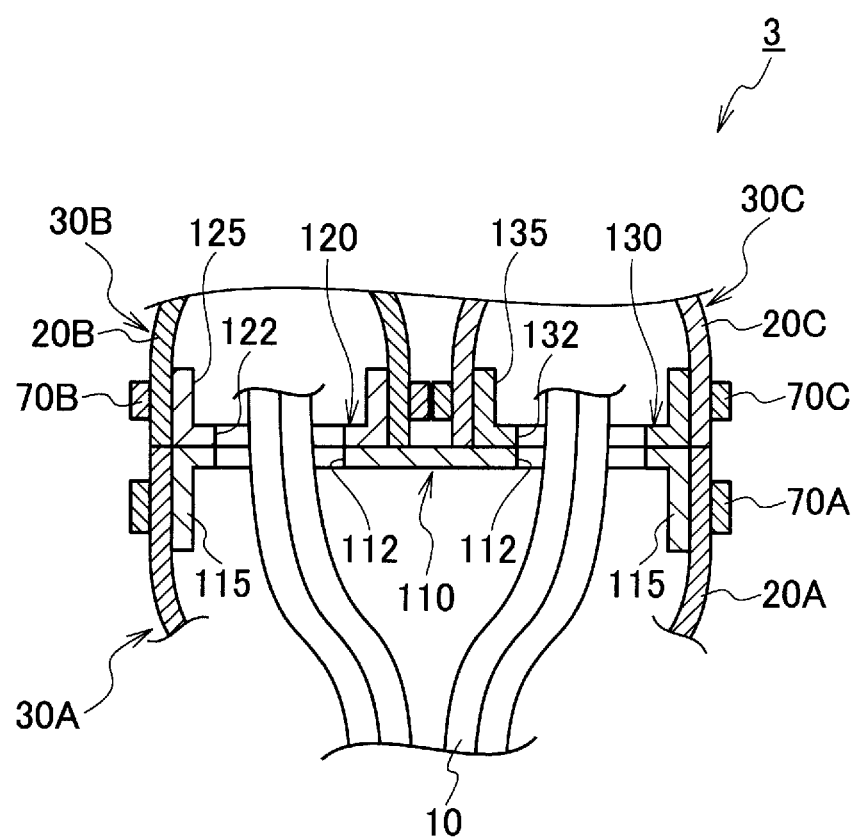
FIG. 8 is a cross sectional view illustrating a mounting portion of a cable branch structure according to a third embodiment.

With respect to a cable branch structure 3 according to a third embodiment, an explanation will be made with reference to FIG. 8. Further, the same reference numerals or signs will be affixed to the same portions as those of the cable branch structures 1, 2 according to the first and second embodiments, and different portions will be mainly explained.

In the first and second embodiments, the main line mounting portion 110 includes the plate-like metal ring 111, the branch line mounting portion 120 includes the plate-like metal ring 121, and the branch line mounting portion 130 includes the plate-like metal ring 131.

On the other hand, according to the third embodiment, the main line mounting portion 110 includes the metal ring 111 having a cylindrical portion 115, the branch line mounting portion 120 includes the metal ring 121 having a cylindrical portion 125, and the branch line mounting portion 130 includes the metal ring 131 having a cylindrical portion 135.

Specifically, an outer peripheral edge of the metal ring 111 is provided with the annular cylindrical portion 115, and the cylindrical portion 115 is covered with the end portion of the main line side braided wire 20A. Further, the main line side braided wire 20A in a state of covering the cylindrical portion 115 is crimped by a crimp member 70A and, thereby, is mounted to the cylindrical portion 115.

An outer peripheral edge of the metal ring 121 is provided with the annular cylindrical portion 125, and the cylindrical portion 125 is covered with the end portion of the branch line side braided wire 20B. An outer peripheral edge of the metal ring 131 is provided with the annular cylindrical portion 135, and the cylindrical portion 135 is covered with the end portion of the branch line side braided wire 20C. The branch line side braided wire 20B in a state of covering the cylindrical portion 125 is crimped by a crimp member 70B and, thereby, is mounted to an outer periphery of the cylindrical portion 125. The branch line side braided wire 20C in a state of covering the cylindrical portion 135 is crimped by a crimp member 70C and, thereby, is mounted to an outer periphery of the cylindrical portion 135. Each of the metal rings 121, 131 is mounted to the metal ring 111 so as to have a direct contact with the metal ring 111.

As explained above, in the third embodiment, similarly to the operations and effects of the first and second embodiments, the production cost of the braided wire 20 can be reduced without branching the braided wire 20 itself, while enabling to reduce the space for disposing the connector 40 mounted to the one end of the shielded cable 30.

Further, in the third embodiment, since the cylindrical portions 115, 125, 135 are provided at the respective metal rings 111, 121, 131, the braided wire 20 can be prevented from causing a friction with the shear surface of each of the metal rings 111, 121, 131. Therefore, breakage of the braided wire 20 can be suppressed, thus enabling the braided wire 20 to improve the performance of preventing the radiation of the electromagnetic waves (so-called a shield reliability).

Further, it is not a must to provide the cylindrical portions 115, 125, 135 at all of the main line mounting portion 110 and the branch line mounting portions 120, 130, respectively. Instead, a flange portion may be provided at either one of the following two: i) the main line mounting portion 110 and ii) the branch line mounting portions 120, 130.

Further, it is not a must to mount the main line side braided wire 20A and the branch line side braided wires 20B, 20C to the cylindrical portions 115, 125, 135 by the crimp members 70A, 70B, 70C, but, for example, the welding W (such as seam welding, spot welding, and soldering) may be used for fixing the main line mounting portion 110 to each of the branch line mounting portions 120, 130.

(4) Other Embodiments

As set forth above, the contents of the present invention have been disclosed according to the embodiments of the present invention; however, the statements and drawings constituting a part of the disclosure should not be interpreted to limit the present invention. Various alternative embodiments, examples and operational technologies will be obvious from the disclosure to a person skilled in the art.

For example, the embodiments of the present invention can be changed as follows. Specifically, it has been explained that the shielded cable 30 is branched from the main line 30A into the two branch lines, that is, the branch lines 30B, 30C. However, not limited to this, the shielded cable 30 may be branched from the main line 30A into two or more branch lines.

Further, it has been explained that the mounting portion 100 is provided at the main line side braided wire 20A and each of the branch line side braided wires 20B, 20C. However, not limited to this, the mounting portion 100 may be provided for at least either one of the following two: i) the main line side braided wire 20A and ii) the branch line side braided wires 20B, 20C.

Further, it is a matter of course that the connector 40 or the like to which the shielded cable 30 is mounted is not limited to the one explained in the embodiments and may, otherwise, be a known one having another structure.

In this way, it is a matter of course that the present invention includes various embodiments or the like not described herein. Thus, the technical scope of the present invention is defined only by the proper inventive specific matters which are proper from the above explanation and recited in the scope of claims.

The invention claimed is:

1. A cable branch structure for branching, from a main line into a plurality of branch lines, a shielded cable with a plurality of electric wires covered with a braided wire, the braided wire comprising:
   a main line side braided wire constituting a part corresponding to the main line;
   a plurality of branch line side braided wires, respectively, constituting parts corresponding to the respective branch lines;
   a first mounting portion provided at an end portion of the main line side braided wire for mounting end portions of the branch line side braided wires; and
   second mounting portions provided at each of the end portions of the branch line side braided wires for mounting the end portion of the main line side braided wire, the second mounting portions mounted to the first mounting portion by welding, or bolts and nuts.

2. The cable branch structure according to claim 1 wherein
   the first mounting portion includes a main line mounting portion configured to be mounted to the end portion of the main line side braided wire, and
   the main line mounting portion is formed with a plurality of branch line mounting openings to which the end portions of the respective branch line side braided wires are mounted, and the electric wires corresponding to each of the branch lines are inserted into one of the branch line mounting openings.

3. The cable branch structure according to claim 1 wherein
   each of the second mounting portions includes a branch line mounting portion provided at each of the end portions of the respective branch line side braided wires, and
   the branch line mounting portion is formed with a main line mounting opening to which the end portion of the main line side braided wire is mounted, and the electric wires corresponding to each of the branch line are inserted into the main line mounting opening.

4. The cable branch structure according to claim 1 wherein
   the first mounting portion includes a metal ring around which the end portion of the main line side braided wire wound, and
   the metal ring is formed with inserting holes each into which, among the plurality of the electric wires, the electric wires corresponding to one of the branch lines which are branched from the electric wires corresponding to another of the branch lines are inserted.

5. The cable branch structure according to claim 4, wherein the metal ring comprises an ellipsoidal plate-like metal ring around which the end portion of the main line side braided wire is wound.

6. The cable branch structure according to claim 5, wherein the ellipsoidal metal ring is formed with central side bulging portions formed between the first inserting hole and the second inserting hole, and end portion side bulging portions formed at one side end portion of each of the inserting holes.

7. The cable branch structure according to claim 2, wherein the main line mounting portion includes a metal ring, wherein an outer peripheral edge of the metal ring is provided with an annular cylindrical portion covered with the end portion of the main line side braided wire.

8. The cable branch structure according to claim 3, wherein the branch line mounting portion includes a metal ring, wherein an outer peripheral edge of the metal ring is provided with an annular cylindrical portion covered with the end portion of the branch line side braided wire.

9. The cable branch structure according to claim 1, wherein the shielded cable with a plurality of electric wires covered with the braided wire provide a connection between devices accommodated in a conductive metal case, and the main line side braided wire and the plurality of branch side line braided wires are electrically connected to the metal case for preventing the radiation of electromagnetic waves.

10. The cable branch structure according to claim 1, wherein each of the plurality of branch line side braided wires is formed as a separate body from the main line side braided wire.

11. The cable branch structure according to claim 1, wherein a first end portion of each of the plurality of branch line side braided wires is fixed to a metal shell by being crimped with a crimp member so as to cover a part of the metal shell.

12. The cable branch structure according to claim 1, wherein the main line mounting portion is capable of individually mounting the end portion of each of the plurality of branch line side braided wires to the end portion of the main line side braided wire.

13. The cable branch structure according to claim 1, wherein
the second mounting portion includes a metal ring around which each of the end portions of the branch line side braided wires is wound, and
the metal ring is formed with an inserting hole into which, among the plurality of the electric wires, the electric wires corresponding to a respective one of the branch lines which are branched from the electric wires corresponding to another of the branch lines is inserted.

14. The cable branch structure according to claim 13, wherein the metal ring comprises an ellipsoidal plate-like metal ring around which the end portion of the branch line side braided wire is wound.

15. The cable branch structure according to claim 14, wherein the ellipsoidal plate-like metal ring is formed with a central side bulging portion so formed on the other metal ring side as to correspond to a central side bulging portion of the metal ring of the first mounting portion, and an end portion side bulging portion so formed at one side end side of the inserting hole as to correspond to an end portion side bulging portion of the metal ring of the first mounting portion.

16. The cable branch structure according to claim 13, wherein the metal ring of the first mounting portion and the metal ring of the second mounting portion are fixed to each other by the welding.

17. The cable branch structure according to claim 16, wherein the welding comprises one or more of: seam welding, spot welding, and soldering to thereby fix the first mounting portion to the second mounting portion.

18. The cable branch structure according to claim 13, wherein the metal ring of the first mounting portion and the metal ring of the second mounting portion are provided with a flange to prevent the braided wire from causing a friction with a shear surface of the metal ring of the first mounting portion and the metal ring of the second mounting portion and suppressing breakage of the braided wire and improve a shield reliability thereof.

19. The cable branch structure according to claim 13, wherein the metal ring of the first mounting portion and the metal ring of the second mounting portion are fixed to each other with the bolts and the nuts.

20. The cable branch structure according to claim 19, wherein the metal ring of the first mounting portion and the metal ring of the second mounting portion comprise central side bulging portions and end portion side bulging portions formed respectively with bolt inserting holes into each of which respective ones of the bolts are inserted and tightening respective ones of the nuts with the respective ones of the bolts inserted into each of the bolt inserting holes fixes the metal ring of the first mounting portion to the metal ring of the second mounting portion.

\* \* \* \* \*